US011276353B2

(12) United States Patent
Park et al.

(10) Patent No.: US 11,276,353 B2
(45) Date of Patent: Mar. 15, 2022

(54) DISPLAY PANEL AND DISPLAY DEVICE INCLUDING THE SAME

(71) Applicant: Samsung Display Co., Ltd., Yongin-si (KR)

(72) Inventors: Junhyun Park, Suwon-si (KR); Bon-Yong Koo, Hwaseong-si (KR); Yu-Jin Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/860,753

(22) Filed: Apr. 28, 2020

(65) Prior Publication Data
US 2020/0402466 A1     Dec. 24, 2020

(30) Foreign Application Priority Data
Jun. 24, 2019  (KR) .......................... 10-2019-0074996

(51) Int. Cl.
*G09G 3/3275* (2016.01)
*G09G 3/3266* (2016.01)
*H01L 27/32* (2006.01)

(52) U.S. Cl.
CPC ......... *G09G 3/3275* (2013.01); *G09G 3/3266* (2013.01); *H01L 27/3276* (2013.01); *G09G 2310/0264* (2013.01)

(58) Field of Classification Search
CPC ............... G09G 3/3275; G09G 3/3266; G09G 2310/0264; G09G 3/3233; G09G 2310/0251; G09G 2320/045; G09G 2300/0852; G09G 2300/0861; G09G 2310/0262; G09G 2300/0426; G09G 2300/0819; G09G 3/3208; H01L 27/3276
See application file for complete search history.

(56) References Cited

U.S. PATENT DOCUMENTS

| 2009/0033822 A1* | 2/2009 | Chung ................. G09G 3/3611 349/54 |
| 2014/0374703 A1* | 12/2014 | Jung .................... H01L 51/0031 257/40 |
| 2016/0365035 A1* | 12/2016 | Park ...................... G09G 3/3266 |
| 2017/0162111 A1* | 6/2017 | Kang .................. H01L 27/3276 |
| 2017/0337873 A1* | 11/2017 | Kim ..................... H01L 27/3276 |

FOREIGN PATENT DOCUMENTS

KR    10-2015-0043647 A    4/2015

* cited by examiner

*Primary Examiner* — Mark W Regn
(74) *Attorney, Agent, or Firm* — Lewis Roca Rothgerber Christie LLP

(57) ABSTRACT

A display device includes a display panel including a display and a non-display area, data lines, driving lines, power lines, and pixels connected to said lines being at the display area, a data driver for generating data signals supplied to the pixels, a power supply for generating a power signal supplied to the pixels, and a driving circuit at the non-display area and for generating driving signals supplied to the pixels, the driving circuit including stages for providing the driving signals to at least two of the driving lines, wherein data fan-out lines connected to the data driver are connected to the data lines, a power supply line connected to the power supply is connected to the power lines, and the driving circuit is connected to the driving lines, through a first connection line, a second connection line, a third connection line, and a fourth connection line.

16 Claims, 6 Drawing Sheets

DISPLAY PANEL AND DISPLAY DEVICE INCLUDING THE SAME

CROSS-REFERENCE TO RELATED APPLICATION

This application claims priority to and the benefit of Korean Patent Application No. 10-2019-0074996, filed on Jun. 24, 2019 in the Korean Intellectual Property Office (KIPO), the entire disclosure of which is incorporated by reference herein.

BACKGROUND

1. Field

Aspects of the present disclosure relate to a display panel and a display device including the display panel.

2. Description of the Related Art

Recently, various flat panel display devices having reduced weight and volume relative to cathode ray tube (CRT) display devices have been developed. The flat display devices include liquid crystal displays (LCDs), field emission displays (FEDs), plasma display panels (PDPs), and organic light emitting displays (OLEDs).

In general, a display panel of an organic light emitting display includes a plurality of pixels and signal lines configured to provide signals to the pixels. The pixels may receive driving signals from signal drivers configured to provide the signals. For example, the pixels of the display panel may be provided with data signals from a data driver, scan signals from a scan driver, light emission control signals from a light emission controller, and power signals from a power supply. As pixel structures and shapes of the display panel are diversified, various approaches of connecting the signal lines to the signal drivers have been studied.

SUMMARY

Aspects of embodiments are directed to a display panel in which signal lines and a signal driver are easily connected.

Aspects of embodiments are directed to a display device in which signal lines and a signal driver of a display panel are easily connected.

According to some embodiments, there is provided a display device including: a display panel including a display area configured to display an image and a non-display area surrounding the display area, wherein data lines, driving lines, power lines, and pixels connected to the data lines, the driving lines, and the power line are located at the display area; a data driver configured to generate data signals supplied to the pixels; a power supply configured to generate a power signal supplied to the pixels; and a driving circuit at the non-display area and configured to generate driving signals supplied to the pixels, the driving circuit including stages configured to provide the driving signals to at least two of the driving lines, wherein data fan-out lines connected to the data driver are connected to the data lines, a power supply line connected to the power supply is connected to the power lines, and the driving circuit is connected to the driving lines, through a first connection line, a second connection line, a third connection line, and a fourth connection line.

In some embodiments, the display area has a rectangular shape with rounded corners, and the non-display area has a shape corresponding to that of the display area, the non-display area includes a first area corresponding to a rounded corner located at a lower side of the display area, and a second area corresponding to a lateral side of the display area and a rounded corner located at an upper side of the display area.

In some embodiments, the data fan-out lines include a first fan-out line and a second fan-out line located at different layers, the first and second fan-out lines being connected to the first connection line in the first area.

In some embodiments, in the first area, the third connection line connects the power supply to the power lines, the fourth connection line connects the driving circuit to one of the driving lines, and the second connection line connects the driving circuit to another one of the driving lines.

In some embodiments, the second connection line connects the driving circuit to one of the driving lines in the first area.

In some embodiments, the driving circuit includes a first driving circuit including first stages configured to generate a first driving signal of the driving signals, and a second driving circuit including second stages configured to generate a second driving signal of the driving signals.

In some embodiments, in the second area, the first connection line connects the first driving circuit to a first driving line of the driving lines, the second connection line connects the second driving circuit to one of second driving lines of the driving lines, the third connection line connects the power supply to the power lines, and the fourth connection line connects the second driving circuit to another one of the second driving lines.

In some embodiments, the fourth connection line connects the second driving circuit to one of second driving lines in the second area.

In some embodiments, the first driving signal includes a scan signal, and the second driving signal includes a light emission control signal.

In some embodiments, the first connection line and the second connection line are at different layers.

In some embodiments, the first connection line and a gate electrode of a driving transistor in a pixel of the pixels are at a same layer, and the second connection line and an electrode of a capacitor in the pixel are at a same layer.

In some embodiments, the third and fourth connection lines and source-drain electrodes of a driving transistor in a pixel of the pixels are at a same layer.

According to some embodiments, there is provided a display panel including: a substrate including a display area and a non-display area surrounding the display area; a plurality of pixels in the display area; data lines connected to the pixels; driving lines connected to the pixels; power lines connected to the pixels; data fan-out lines in the non-display area and configured to receive data signals; power supply lines in the non-display area and configured to receive a power signal; and stages in the non-display area and configured to generate driving signals supplied to the pixels and to provide the driving signals to at least two of the driving lines, wherein the data fan-out lines are connected to the data lines, the power supply line is connected to the power lines, and the stages are connected to the driving lines, through a first connection line, a second connection line, a third connection line, and a fourth connection line.

In some embodiments, the display area has a rectangular shape with rounded corners, and the non-display area has a shape corresponding to that of the display area, wherein the non-display area includes a first area corresponding to a rounded corner located at a lower side of the display area, and a second area corresponding to a lateral side of the display area and a rounded corner located at an upper side of the display area.

In some embodiments, the data fan-out lines include a first fan-out line and a second fan-out line located at different layers, the first and second fan-out lines being connected to the first connection line in the first area.

In some embodiments, in the first area, the third connection line connects a power supply to the power lines, the fourth connection line connects a driving circuit to one of the driving lines, and the second connection line connects the driving circuit to another one of the driving lines.

In some embodiments, the second connection line connects a driving circuit to one of the driving lines in the first area.

In some embodiments, the display panel further includes a driving circuit, the driving circuit includes a first driving circuit including first stages configured to generate a first driving signal, and a second driving circuit including second stages configured to generate a second driving signal.

In some embodiments, in the second area, the first connection line connects the first driving circuit to a first driving line of the driving lines, the second connection line connects the second driving circuit to one of second driving lines of the driving lines, the third connection line connects a power supply to the power lines, and the fourth connection line connects the second driving circuit to another one of the second driving lines.

In some embodiments, the fourth connection line connects the second driving circuit to one of second driving lines in the second area.

In the display panel and the display device including the display panel, according to some embodiments, the data fan-out lines are connected to a data line through the first connection line at a lower portion of the display panel, and the second connection line is used as a routing line. Accordingly, the signal lines and the signal drivers may be easily connected. In addition, in the display panel and the display device including the display panel, according to some embodiments, the fourth connection line is used as a routing line at a side portion of the display panel so that the signal lines and the signal drivers may be easily connected.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Hereinafter, display panels and display devices in accordance with embodiments will be explained in detail with reference to the accompanying drawings.

Figure 1:
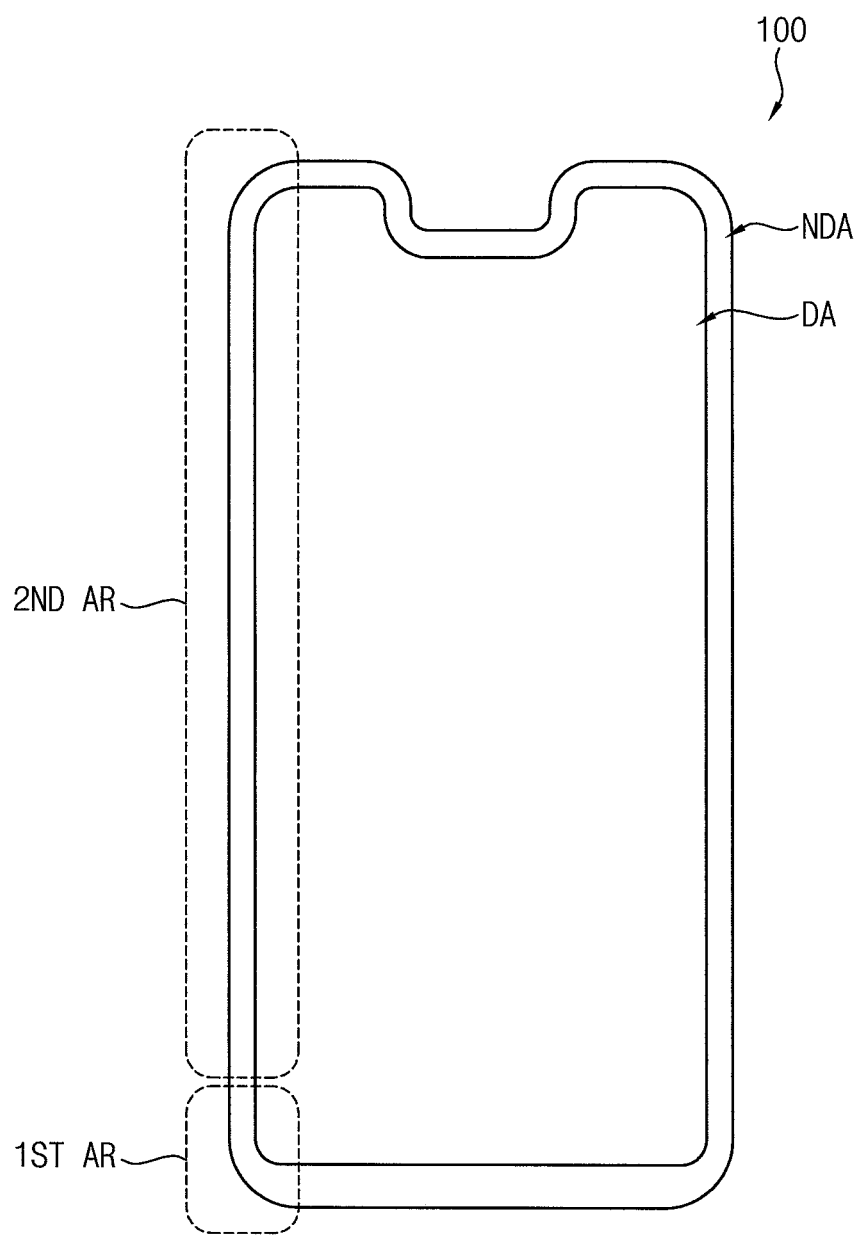
FIG. 1 is a plan view showing a display device according to some example embodiments of the present invention.

FIG. 1 is a plan view showing a display device according to some example embodiments of the present invention.

Figure 2:
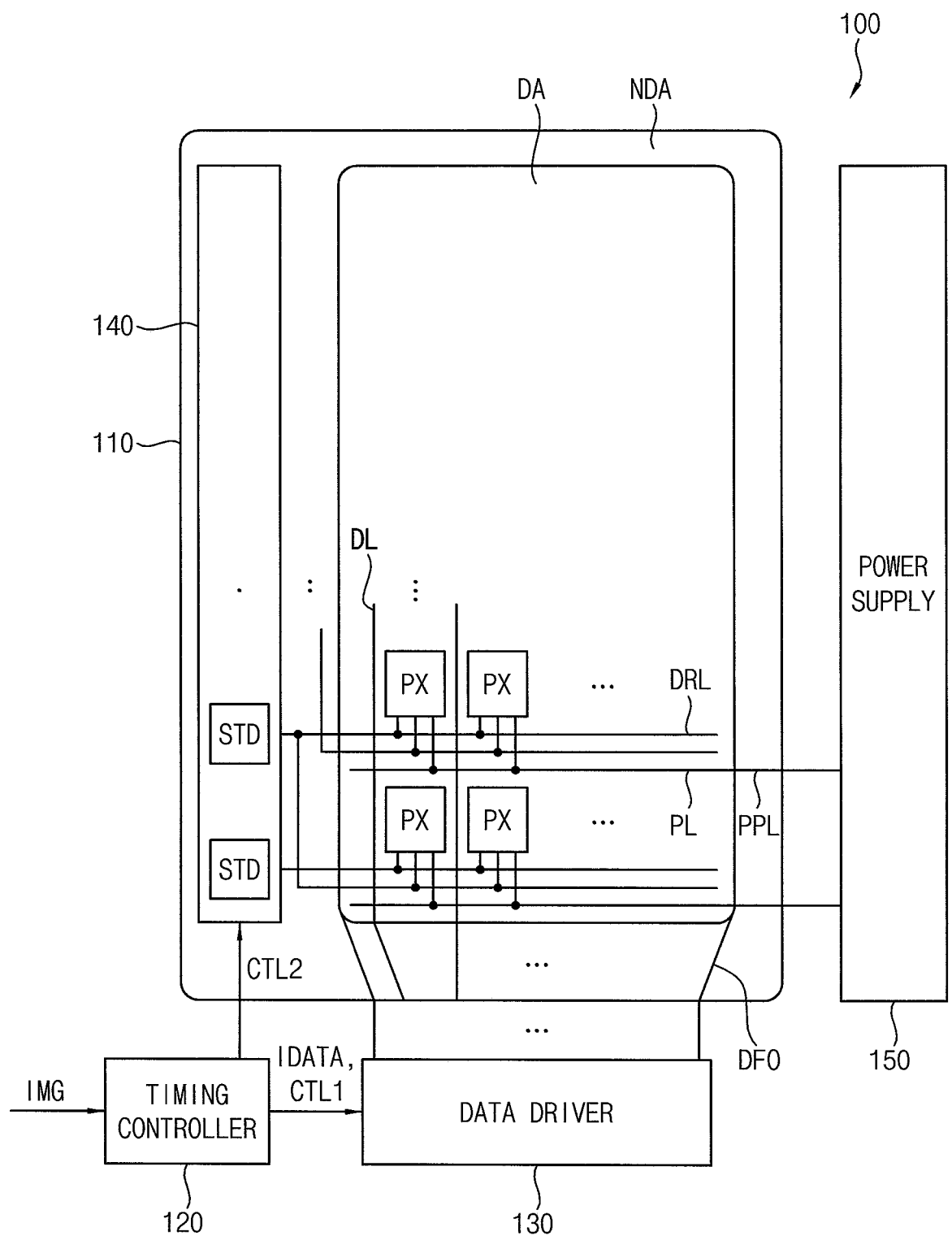
FIG. 2 is a block diagram showing the display device of FIG. 1.

FIG. 2 is a block diagram showing the display device of FIG. 1.

Figure 3:
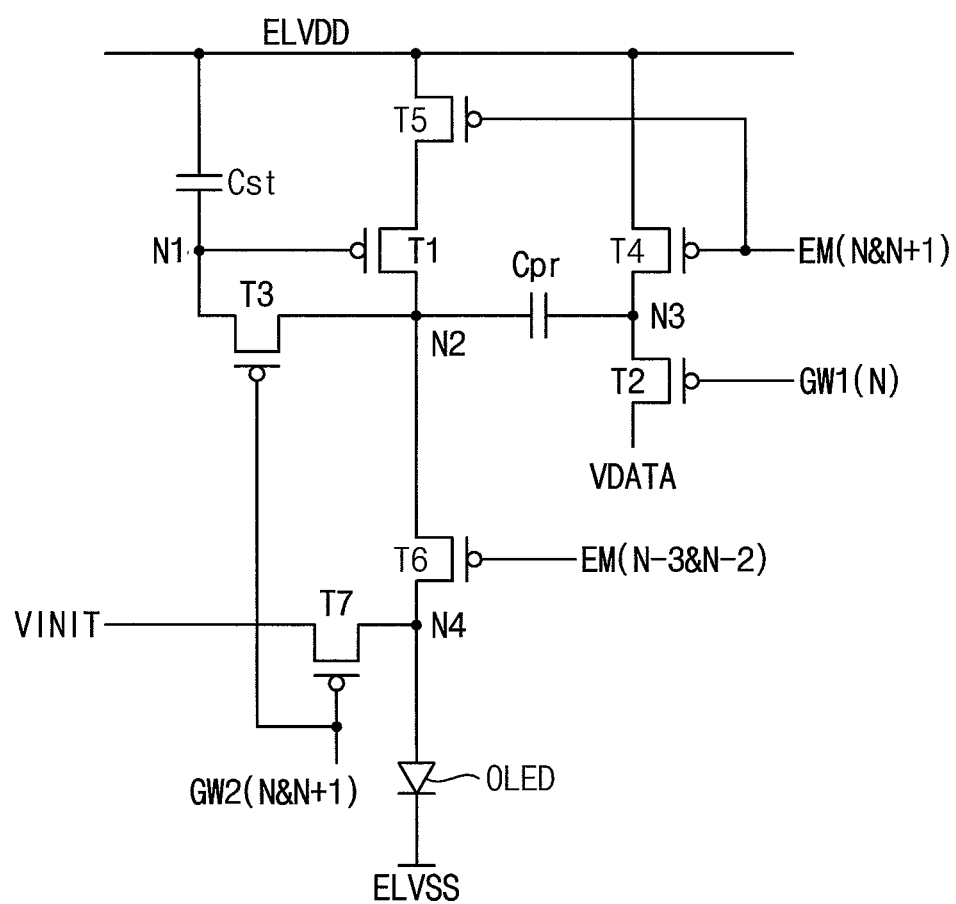
FIG. 3 is a circuit diagram showing an example of a pixel included in the display device of FIG. 2.

FIG. 3 is a circuit diagram showing an example of a pixel included in the display device of FIG. 2.

Referring to FIGS. 1 and 2, a display device 100 may include a display panel 110, a timing controller 120, a data driver 130, a driving circuit unit (e.g., a driving circuit) 140, and a power supply 150.

The display panel 110 may include a display area DA and a non-display area NDA. Data lines DL, driving lines DRL, and power lines PL may be formed in the display area DA. A plurality of pixels PX connected to the data lines DL, the driving lines DRLs, and the power lines PL may be formed in the display area DA. Each of the pixels PX may emit light in response to signals supplied through the data lines DL, the driving lines DRL, and the power lines PL. An image may be displayed in the display area DA by operations of the pixels PX. As shown in FIGS. 1 and 2, the display area DA of the display panel 110 may have a rectangular shape formed with rounded corners.

Data fan-out lines DFO connected to the data driver 130 configured to generate data signals, the driving circuit unit 140 configured to generate driving signals, the power supply lines PPL connected to the power supply 150, and/or the like may be provided in the non-display area NDA. In addition, first connection lines, second connection lines, third connection lines, and fourth connection lines that connect the data fan-out lines DFO to the data lines DL, the power supply lines PPL to the power lines PL, and the driving circuit unit 140 to the driving lines DRL, may be formed in the non-display area NDA. The data fan-out lines DFO may include a first fan-out line and a second fan-out line. The first fan-out line and the second fan-out line may be formed at different layers. In addition, the first connection lines, the second connection lines, the third connection lines, and the fourth connection lines may be formed at different layers. For example, the first connection lines may be formed at the same layer as gate electrodes of transistors included in the pixel PX, and the second connection lines may be formed at the same layer as first and second electrodes of capacitors included in the pixel PX. In addition, the third and fourth connection lines may be formed at the same layer as source and drain electrodes of transistors included in the pixel. As shown in FIGS. 1 and 2, the non-display area NDA of the display panel 110 may correspond to the shape of the display area DA. In other words, the non-display area NDA of the display panel 110 may have a shape corresponding to the shape of the display area DA. The non-display area NDA may include a first area 1ST AR corresponding to the rounded corner positioned at a lower side of the display area DA, and a second area 2ND AR corresponding to a lateral side and the rounded corner positioned at an upper side of the display area DA. For example, the data fan-out lines DFO may be connected to the data lines DL in the first area 1ST AR of the non-display area NDA, and the driving circuit unit 140 may be connected to the driving lines DRL, and the power supply lines PPL may be connected to the power lines PL in the second area 2ND AR of the non-display area NDA.

The timing controller 120 may convert image data IMG supplied from an external device into input image data IDATA, and may generate a first control signal CTL1 and a second control signal CTL2 that control a driving of the input image data DATA. The timing controller 120 may convert the image data IMG supplied from the external device into the input image data IDATA by applying an algorithm (such as dynamic capacitance compensation (DCC)) configured to correct image quality to the image data IMG. When the timing controller 120 does not include the algorithm for improving image quality, the image data IMG may be outputted as the input image data DATA without changes. The timing controller 120 may provide the input image data DATA to the data driver 130. The timing controller 120 may receive an input control signal CON from the external device, and may generate the first control signal CTL1 provided to the data driver 130 and the second control signal CTL2 provided to the driving circuit unit 140.

The data driver 130 may generate an analog-type data voltage based on the input image data IDATA received from the timing controller 120. The data driver 130 may supply a data voltage through the data fan-out lines DFO.

The driving circuit unit 140 may be an embedded circuit provided in the non-display area NDA of the display panel 110. In one embodiment, the driving circuit unit 140 is a scan driver configured to generate a scan signal. In another embodiment, the driving circuit unit 140 is a light emission controller configured to generate a light emission control signal. In another embodiment, the driving circuit unit 140 includes a scan driver configured to generate a scan signal and a light emission controller configured to generate a light emission control signal. The driving circuit unit 140 may include a plurality of stages STD. Each of the stages STD may generate a driving signal based on the second control signal CTL2 received from the timing controller 120. The driving signal generated in each of the stages STD may be provided to at least two driving lines DRL. Although FIG. 2 shows that the driving circuit unit 140 is disposed at the non-display area NDA positioned at a left side of the display area DA, the position of the driving circuit unit 140 is not limited thereto. For example, the driving circuit unit 140 may be disposed at the non-display area NDA positioned at a right side of the display area DA, or disposed at the non-display area NDA positioned at both of the left and right sides of the display area DA. In addition, although FIG. 1 shows an example in which each stage STD generates one driving signal, each stage STD included in the driving circuit unit 140 may generate at least one driving signal. For example, when the driving circuit unit 140 is the scan driver, each stage STD may generate a first scan signal and a second scan signal.

The power supply 150 may generate a power signal supplied to the pixels PX. For example, the power supply 150 may generate a high-power voltage ELVDD, a low power voltage ELVSS, an initialization voltage VINIT, and the like supplied to the pixels PX. The power supply 150 may supply a power signal through the power supply lines PPL formed in the display panel 110.

Referring to FIG. 3, the pixel PX may include a first transistor T1, a second transistor T2, a third transistor T3, a fourth transistor T4, a fifth transistor T5, a sixth transistor T6, and a seventh transistor T7, a first capacitor Cst, a second capacitor Cpr, and an organic light emitting diode OLED. The first transistor T1 may include a gate electrode connected to a first node N1, a first electrode connected to the fifth transistor T5, and a second electrode connected to a second node N2. The second transistor T2 may include a gate electrode provided with (e.g., configured to receive) a first scan signal GW1, a first electrode connected to a third node N3, and a second electrode provided with (e.g., configured to receive) a data voltage VDATA. The third transistor T3 may include a gate electrode provided with (e.g., configured to receive) a second scan signal GW2, a first electrode connected to a first node N1, and a second electrode connected to a second node N2. The fourth transistor T4 may include a gate electrode provided with (e.g., configured to receive) a light emission control signal EM, a first electrode provided with (e.g., configured to receive) a high-power voltage ELVDD, and a second electrode connected to a third node N3. The fifth transistor T5 may include a gate electrode provided with (e.g., configured to receive) a light emission control signal EM, a first electrode provided with (e.g., configured to receive) a high-power voltage ELVDD, and a second electrode connected to the first transistor T1. The sixth transistor T6 may include a gate electrode provided with (e.g., configured to receive) a light emission control signal EM, a first electrode connected to a second node N2, and a second electrode connected to a fourth node N4. The seventh transistor T7 may include a gate electrode provided with (e.g., configured to receive) a second scan signal GW2, a first electrode provided with (e.g., configured to receive) an initialization voltage VINIT, and a second electrode connected with a fourth node N4. The first capacitor Cst may include a first electrode provided with (e.g., configured to receive) a high-power voltage ELVDD and a second electrode connected to a first node N1. The second capacitor Cpr may include a first electrode connected to a second node N2 and a second electrode connected to a second node N2. The organic light emitting diode OLED may include an anode electrode connected to a fourth node N4 and a cathode electrode provided with (e.g., configured to receive) a low power supply voltage ELVSS. As shown in FIG. 3, the scan signals GW1 and GW2 generated by the scan driver, or the light emission control signal EM generated by the light emission controller, may be provided to at least two pixels PX. Accordingly, the number of driving lines DRL for supplying driving signals (i.e., the scan signals GW1 and GW2 and the light emission control signal EM) of the display panel 110 increases, and thus connecting lines for connecting the driving circuit unit 140 (i.e., the scan driver and the light emission controller) to the driving lines DRL may be insufficient in the non-display area NDA. In the display device 100 according to some embodiments of the present invention, the first to fourth connection lines are used as routing lines in the first area 1ST AR and the second area 2ND AR of the display panel 110, such that the data fan-out lines DFO, the driving circuit unit 140, the power supply line PPL formed in the non-display area NDA, and the data lines DL, the driving lines DRLs, and the power lines PL formed in the display area DA may be easily connected to each other.

In the display device 100 according to some embodiments of the present invention, the first fan-out line and the second fan-out line formed at different layers in the first area 1ST AR are connected to the same line (i.e., the first connection line). In the related art, the first fan-out line and the second fan-out line formed at different layers are connected to the first connection line and the second connection line formed at different layers. In the display device 100 according to some embodiments of the present invention, the first fan-out line and the second fan-out line are connected to the first connection lines in the first area 1ST AR, so that the second connection line may be used as a routing line. For example, the first fan-out line and the second fan-out line may be connected to the first connection lines in the first area 1ST AR. The first connection lines may extend in the display area DA to connect the fan-out lines to the data lines DL. In addition, in the first region 1ST AR, the third connection lines may connect the power supply lines PPL to the power lines PL, the fourth connection lines may connect the driving circuit unit 140 to one of the driving lines DRL, and the second connection lines may connect the driving circuit unit 140 to another one of the driving lines DRL. Although the third connection lines for connecting the power supply lines PPL to the power lines PL, and the fourth connection lines for connecting the driving circuit unit 140 to one of the driving lines DRL, in the first area 1ST AR, have described with reference to FIGS. 1 and 2, configurations of the third connection lines and the fourth connection lines are not limited thereto. For example, the third connection lines and the fourth connection lines may connect the power supply lines PPL to the power lines PL, and supply different power signals (such as the low power supply voltage ELVSS and the initialization voltage VINIT) to the power lines PL. As described above, in the display device 100 according to some embodiments of the present invention, the first and second fan-out lines included in the data fan-out line DFO in the first area 1ST AR are connected to the data lines DL of the display area DA through the first connection lines, and the second connection line may be used as the routing line for connecting the driving circuit unit 140 to one of the driving lines DRL, so that signal lines (i.e., the data lines DL, the driving lines DRL, and the power lines PL) may be easily connected to signal drivers (i.e., the data driver 130, the driving circuit unit 140, and the power supply 150) in the first area 1ST AR.

According to some embodiments, in the display device 100, the fourth connection line are connected to one of the driving circuit unit 140 and the driving lines DRL in the second area 2ND AR. The fourth connection line may connect the power supply lines PPL to the power lines PL in the first area 1ST AR, and may connect the driving circuit unit 140 to one of the driving lines DRL in the second area 2ND AR. The fourth connection line in the first area 1ST AR and the fourth connection line in the second area 2ND AR may be formed at the same layer, but may not be connected to each other. In the display device 100 according to some embodiments of the present invention, the fourth connection line is used as a routing line for connecting the driving circuit unit 140 to one of the driving lines DRL in the second area 2ND AR. For example, the first connection line may connect the driving circuit unit 140 to one of the driving lines DRL, the second connection line may connect the driving circuit unit 140 to another one of the driving lines DRL, the third connection line may connect the power supply lines PPL to the power lines PL, and the fourth connection line may connect the driving circuit unit 140 to the other one of the driving lines DRL. In other words, each of the stages STD of the driving circuit unit 140 may be connected to three driving lines DRL. In some embodiments, the driving circuit unit 140 includes first driving stages and second driving stages configured to generate a first driving signal and a second driving signal, respectively, and at least one of the first driving stage and the second driving stage is connected to two driving lines DRL. For example, the driving circuit unit 140 may include a first driving circuit unit including first stages configured to generate a first driving signal, and a second driving circuit unit including second stages configured to generate a second driving signal. When each of the first stages is connected to one driving line DRL and each of the second stages is connected to two driving lines DRL, the first connection line may connect the first driving circuit unit to the first driving line DRL, the second connection line may connect the second driving circuit unit to one of the second driving lines DRL, the third connection line may connect the power supply lines PPL to the power lines PL, and the fourth connection line may connect the second driving circuit unit to another one of the second driving lines DRL, in the second area 2ND AR. As described above, in the display device 100 according to some embodiments of the present invention, the fourth connection line is used as a routing line in the second area 2ND AR, such that signal lines (i.e., the driving lines DRL, and the power lines PL) may be easily connected to signal drivers (i.e., the driving circuit unit 140 and the power supply 150) in the second area 2ND AR.

Figure 4:
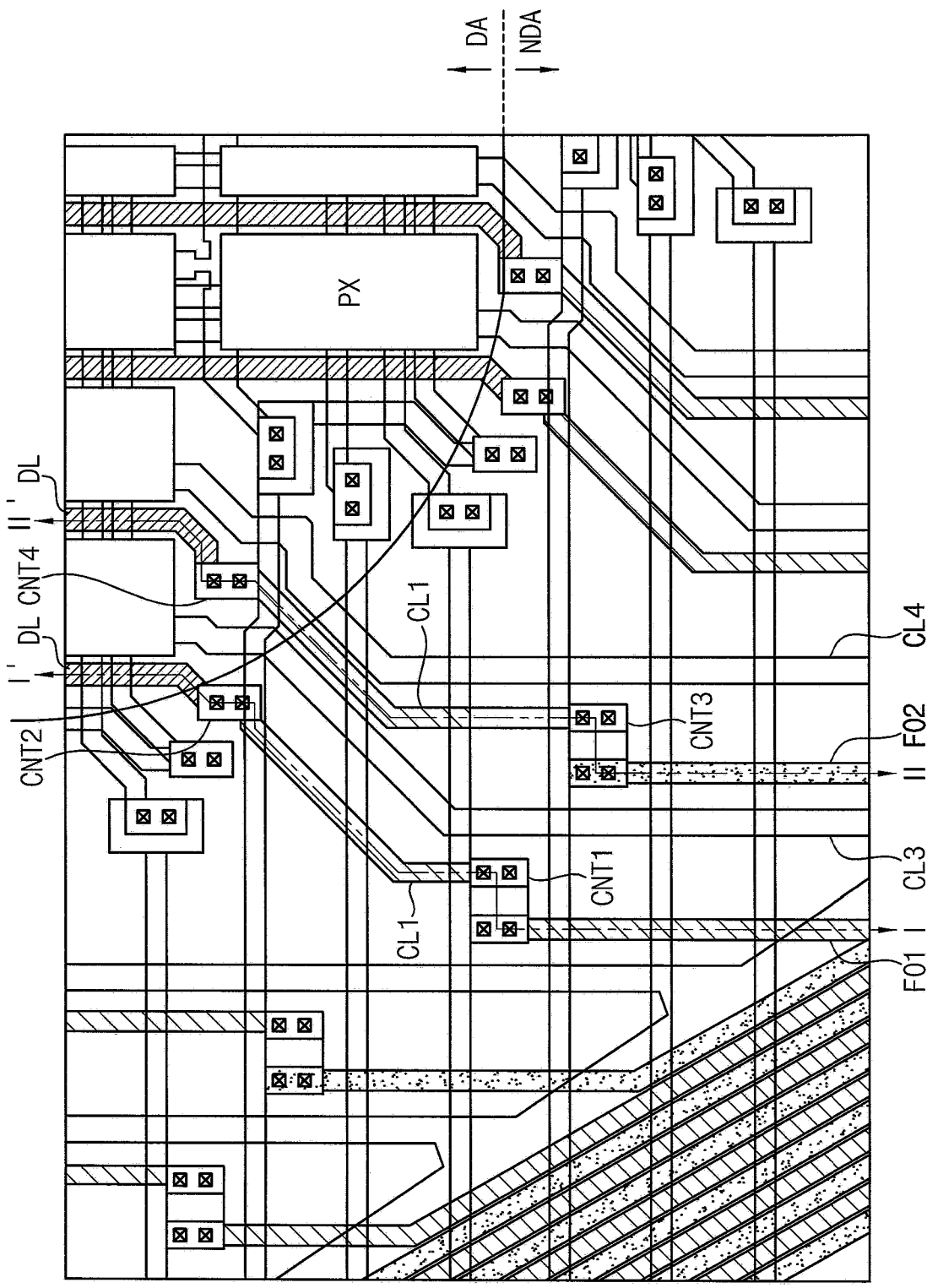
FIG. 4 is a plan view showing a portion of the first area of the display panel included in the display device of FIG. 1.
Figure 5A:
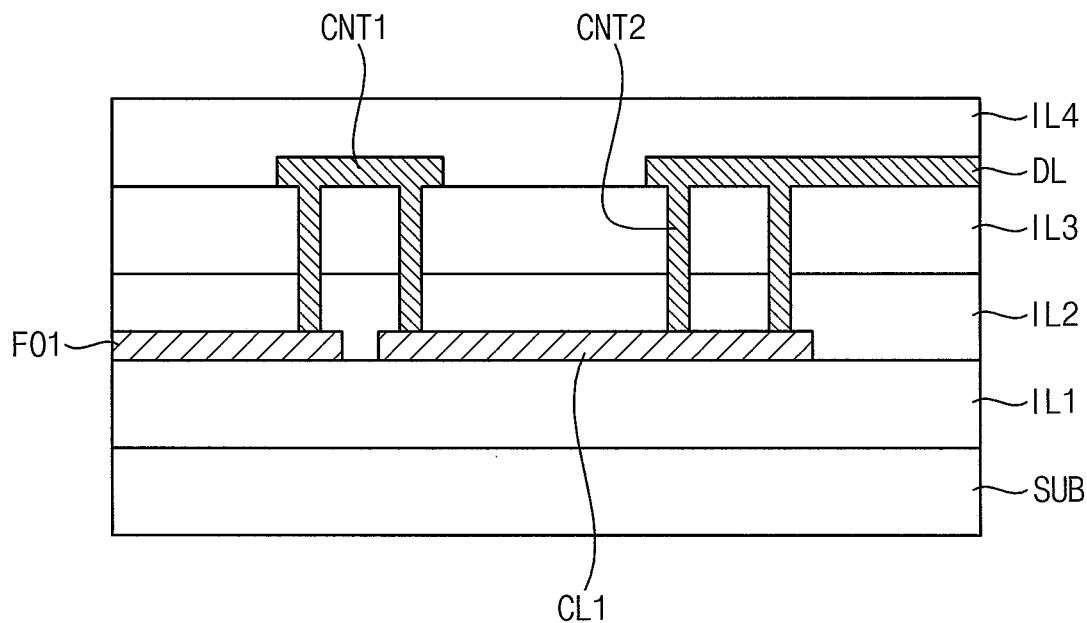
FIG. 5A is a cross-sectional view taken along the line I-I' of FIG. 4.
Figure 5B:
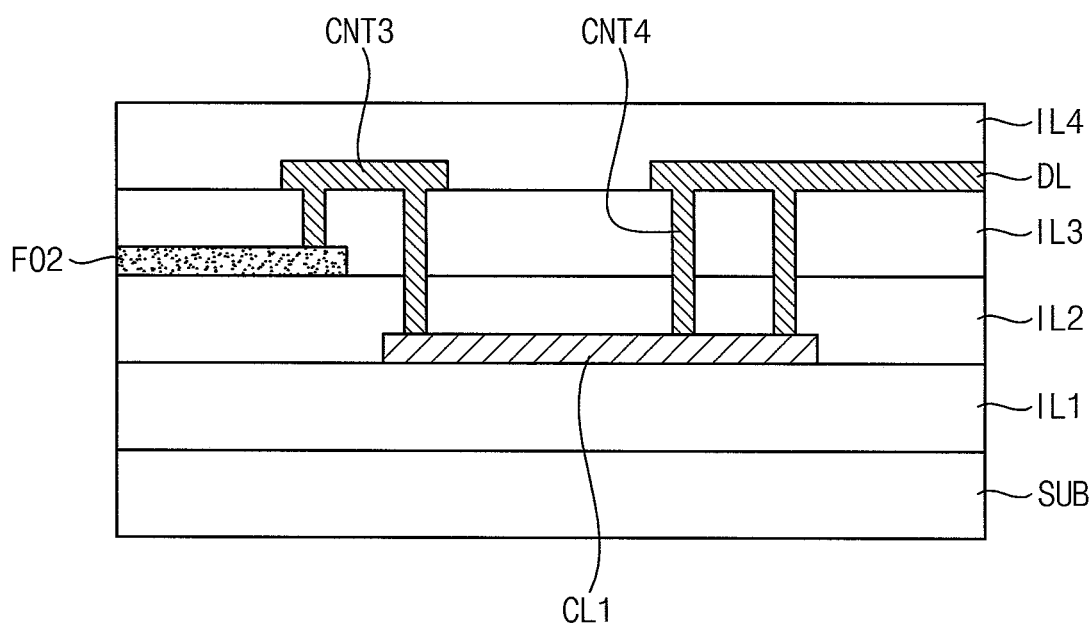
FIG. 5B is a cross-sectional view taken along the line II-II' of FIG. 4.

FIG. 4 is a plan view showing a portion of the first area of the display panel included in the display device of FIG. 1. FIG. 5A is a cross-sectional view taken along the line I-I' of FIG. 4. FIG. 5B is a cross-sectional view taken along the line II-II' of FIG. 4.

Referring to FIG. 4, the data fan-out lines, the first connection lines CL1, and the data lines DL may be connected to each other in the first area of the non-display area NDA. The data fan-out lines may include first fan-out lines FO1 and second fan-out lines FO2. The first fan-out line FO1 and the second fan-out line FO2 may be formed at different layers. The first fan-out line FO1 may be connected to (e.g., electrically connected to) the first connection line CL1 through a first contact CNT1, and the second fan-out line FO2 may be connected to (e.g., electrically connected to) the first connection line CL1 through a third contact CNT3. The first connection line CL1 connected to the first fan-out line FO1 may be connected to (e.g., electrically connected to) the data line DL through a second contact CNT2, and the first connection line CL1 connected to the second fan-out line FO2 may be connected to (e.g., electrically connected to) the data line DL through a fourth contact CNT4. Because the position of the first contact CNT1 and the third contact CNT3 may be moved (e.g., during a layout design phase) along a y-axis direction, a line arrangement of the display device including the display area having rounded corners may be easily implemented. In addition, the third connection line CL3 may connect (e.g., electrically connect) the power supply lines to the power lines in the first area, and the fourth connection lines may connect (e.g., electrically connect) the driving circuit unit 140 to one of the driving lines. In some embodiments, the third connection lines and the fourth connection lines in the first area connect (e.g., electrically connect) the power supply lines to the power lines.

Referring to FIGS. 5A and 5B, the display panel may include a substrate SUB, a first insulating layer IL1, a second insulating layer IL2, a third insulating layer IL3, and a fourth insulating layer IL4. The first insulating layer IL1, the second insulating layer IL2, the third insulating layer IL3, and the fourth insulating layer IL4 may be sequentially formed on (e.g., laminated on) the substrate SUB. The first fan-out line FO1 may be formed on the first insulating layer IL1, and the second fan-out line FO2 may be formed on the second insulating layer IL2.

Referring to FIG. 5A, the first connection line CL1 may be formed on the first insulating layer IL1, and the data line DL may be formed on the third insulating layer IL3. The first fan-out line FO1 may be connected to the first connection line CL1 through a first contact CNT1, and the first connection line CL1 may be connected to the data line DL through the second contact CNT2. For example, the first contact CNT1 may be formed at the same layer as the data line DL.

Referring to FIG. 5B, the first connection line CL1 may be formed on the first insulating layer IL1, and the data line DL may be formed on the third insulating layer IL3. The second fan-out line FO2 may be connected to the first connection line CL1 through the third contact CNT3, and the first connection line CL1 may be connected to the data line DL through the fourth contact CNT4. For example, the third contact CNT3 may be formed at the same layer as the data line DL.

The second connection line CL2 may be formed on the second insulating layer IL2. The second connection line CL2 may be used as a routing line for connecting the driving circuit unit to one of the driving lines.

Figure 6:
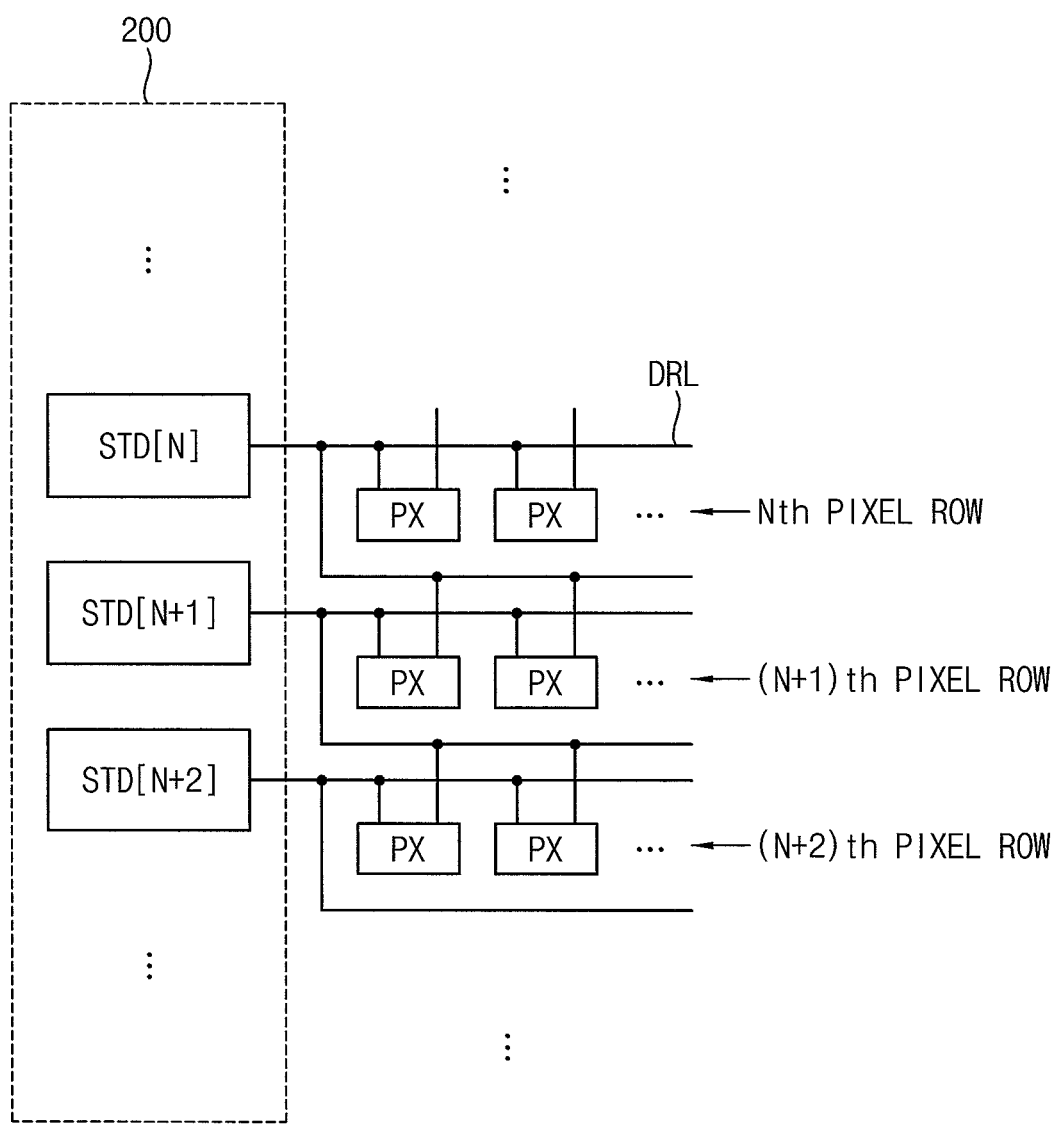
FIG. 6 is a view showing an example of the driving circuit unit included in the display device of FIG. 1.

FIG. 6 is a view showing an example of the driving circuit unit included in the display device of FIG. 1.

Referring to FIG. 6, a driving circuit unit (e.g., a driving circuit) 200 may include a plurality of stages STD [N], STD [N+1], and STD [N+2]. In one embodiment, the driving circuit unit 200 is a scan driver, and a driving signal is a scan signal. In another embodiment, the driving circuit unit 200 is a light emission controller, and the driving signal may be a light emission control signal. In another embodiment, the driving circuit unit 200 includes a scan driver and a light emission controller, and generates the scan signal and the light emission control signal.

Each of the stages STD [N], STD [N+1], and STD [N+2] may generate a driving signal. The driving signal generated in one stage may be provided to at least two driving lines DRL. For example, a driving signal generated in an Nth driving stage STD[N] may be provided to a driving line DRL connected to an Nth pixel row and a driving line DRL connected to an (N+1)th pixel row; a driving signal generated in an (N+1)th driving stage STD[N+1] may be provided to a driving line DRL connected to an (N+1)th pixel row and a driving line DRL connected to an (N+2)th pixel row; and a driving signal generated in an (N+2)th driving stage STD[N+2] may be provided to a driving line DRL connected to an (N+2)th pixel row and a driving line DRL connected to an (N+3)th pixel row. Although FIG. 6 shows the driving circuit unit 200 including stages STD[N], STD[N+1], and STD[N+2] connected to two driving lines DRL, the driving circuit unit 200 is not limited thereto. For example, the driving circuit unit 200 may include stages connected to three driving lines DRL.

As described above, when the number of driving lines DRL connected to the driving circuit unit 200 increases, the connecting lines may be insufficient. In the display device according to some embodiments of the present invention, the first connection line, the second connection line, and the fourth connection line are used as the routing lines for connecting the driving circuit unit 200 to the driving lines DRL in the second area of the non-display area, such that the connection between the signal lines and the signal driver in the second region may be facilitated.

The display device according to the embodiments may be applied to an electronic device including a display device. For example, the display device according to the embodiments may be applied to a television, a computer monitor, a notebook, a digital camera, a mobile phone, a smartphone, a smart pad, a tablet personal computer (PC), a personal digital assistance (PDA), a portable media player (PMP), an MP3 player, a navigation, a video phone, a head mount display (HMD), or the like.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the terms "use," "using," and "used" may be considered synonymous with the terms "utilize," "utilizing," and "utilized," respectively.

Although the display panel and the display device according to the embodiments have been described with reference to the drawings, the illustrated embodiments are merely examples of the inventive concept, and may be modified and changed in a suitable manner as recognized by a person having ordinary knowledge in the relevant technical field without departing from the spirit and scope of the present invention, which is defined by the following claims and equivalents thereof.

What is claimed is:

1. A display device comprising:
a display panel comprising a display area configured to display an image and a non-display area surrounding the display area, wherein data lines, driving lines, power lines, and pixels connected to the data lines, the driving lines, and the power lines are located at the display area;
a data driver configured to generate data signals supplied to the pixels;
a power supply configured to generate a power signal supplied to the pixels; and
a driving circuit at the non-display area and configured to generate driving signals supplied to the pixels, the driving circuit comprising stages configured to provide the driving signals to at least two of the driving lines,
wherein data fan-out lines connected to the data driver are connected to the data lines, a power supply line connected to the power supply is connected to the power lines, and the driving circuit is connected to the driving lines, through a first connection line, a second connection line, a third connection line, and a fourth connection line, and
wherein, in a first area of the non-display area, the data fan-out lines comprise a first fan-out line located at a first layer and a second fan-out line located at a second layer, the first and second fan-out lines being connected to the first connection line at a same layer different from the first layer, and
wherein, in the first area, the second connection line is located at the first layer, and connects the driving circuit to one or more of the driving lines.

2. The display device of claim 1, wherein the display area has a rectangular shape with rounded corners, and the non-display area has a shape corresponding to that of the display area,
wherein the non-display area comprises the first area corresponding to a rounded corner located at a lower side of the display area, and a second area corresponding to a lateral side of the display area and a rounded corner located at an upper side of the display area.

3. The display device of claim 2, wherein the driving circuit comprises a first driving circuit comprising first stages configured to generate a first driving signal of the driving signals, and a second driving circuit comprising second stages configured to generate a second driving signal of the driving signals.

4. The display device of claim 3, wherein, in the second area, the first connection line connects the first driving circuit to a first driving line of the driving lines, the second connection line connects the second driving circuit to one of second driving lines of the driving lines, the third connection line connects the power supply to the power lines, and the fourth connection line connects the second driving circuit to another one of the second driving lines.

5. The display device of claim 3, wherein the fourth connection line connects the second driving circuit to one of second driving lines in the second area.

6. The display device of claim 3, wherein the first driving signal comprises a scan signal, and the second driving signal comprises a light emission control signal.

7. The display device of claim 1, wherein, in the first area, the third connection line connects the power supply to the power lines, the fourth connection line connects the driving circuit to one of the driving lines, and the second connection line connects the driving circuit to another one of the driving lines.

8. The display device of claim 1, wherein the first connection line and the second connection line are at different layers.

9. The display device of claim 8, wherein the first connection line and a gate electrode of a driving transistor in a pixel of the pixels are at a same layer, and the second connection line and an electrode of a capacitor in the pixel are at a same layer.

10. The display device of claim 1, wherein the third and fourth connection lines and source-drain electrodes of a driving transistor in a pixel of the pixels are at a same layer.

11. A display panel comprising:
a substrate comprising a display area and a non-display area surrounding the display area;
a plurality of pixels in the display area;
data lines connected to the pixels;
driving lines connected to the pixels;
power lines connected to the pixels;
data fan-out lines in the non-display area and configured to receive data signals;
power supply lines in the non-display area and configured to receive a power signal; and
stages in the non-display area and configured to generate driving signals supplied to the pixels and to provide the driving signals to at least two of the driving lines,
wherein the data fan-out lines are connected to the data lines, the power supply line is connected to the power lines, and the stages are connected to the driving lines, through a first connection line, a second connection line, a third connection line, and a fourth connection line, and
wherein, in a first area of the non-display area, the data fan-out lines comprise a first fan-out line located at a first layer and a second fan-out line located at a second layer, the first and second fan-out lines being connected to the first connection line at a same layer different from the first layer, and
wherein, in the first area, the second connection line is located at the first layer, and connects one or more of the stages to one or more of the driving lines.

12. The display panel of claim 11, wherein the display area has a rectangular shape with rounded corners, and the non-display area has a shape corresponding to that of the display area,
wherein the non-display area comprises the first area corresponding to a rounded corner located at a lower side of the display area, and a second area corresponding to a lateral side of the display area and a rounded corner located at an upper side of the display area.

13. The display panel of claim 12, further comprising a driving circuit,
wherein the driving circuit comprises a first driving circuit comprising first stages configured to generate a first driving signal, and a second driving circuit comprising second stages configured to generate a second driving signal.

14. The display panel of claim 13, wherein, in the second area, the first connection line connects the first driving circuit to a first driving line of the driving lines, the second connection line connects the second driving circuit to one of second driving lines of the driving lines, the third connection line connects a power supply to the power lines, and the fourth connection line connects the second driving circuit to another one of the second driving lines.

15. The display panel of claim 13, wherein the fourth connection line connects the second driving circuit to one of second driving lines in the second area.

16. The display panel of claim 11, wherein, in the first area, the third connection line connects a power supply to the power lines, the fourth connection line connects a driving circuit to one of the driving lines, and the second connection line connects the driving circuit to another one of the driving lines.

\* \* \* \* \*